United States Patent
Akram

[11] Patent Number: 6,140,151
[45] Date of Patent: *Oct. 31, 2000

[54] SEMICONDUCTOR WAFER PROCESSING METHOD

[75] Inventor: Salman Akram, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 09/083,629

[22] Filed: May 22, 1998

[51] Int. Cl.⁷ .................................................. H01L 21/48
[52] U.S. Cl. ....................... 438/113; 438/460; 438/463; 438/464
[58] Field of Search ..................... 438/460, 461, 438/462, 463, 464, 465, 113, 114; 702/386, 387

[56] References Cited

U.S. PATENT DOCUMENTS

| | | |
|---|---|---|
| 5,238,876 | 8/1993 | Takenchi et al. ............. 437/226 |
| 5,304,418 | 4/1994 | Akada et al. ................. 428/345 |
| 5,310,410 | 5/1994 | Begin et al. .................. 29/25.01 |
| 5,534,102 | 7/1996 | Kadono et al. ................ 156/250 |
| 5,622,900 | 4/1997 | Smith ........................... 438/464 |
| 5,670,260 | 9/1997 | Zajaczkowski et al. ....... 428/345 |
| 5,851,664 | 12/1998 | Bennett et al. ............... 428/343 |
| 5,981,391 | 11/1999 | Yamada ........................ 438/460 |

Primary Examiner—Mary Wilczewski
Assistant Examiner—Yung A. Lin
Attorney, Agent, or Firm—Wells, St. John, Roberts, Gregory & Matkin, P.S.

[57] ABSTRACT

Adhesive force on less than all die on a cutting support film after cutting is reduced such that only selected die are readily displaceable from the tape or film. In one embodiment, a semiconductor wafer surface is adhered to an area on radiation sensitive tape. The wafer is processed on the tape. Cutting such wafer into individual die is one example processing. Less than all of the tape area is then exposed to radiation effective to reduce degree of adhesion of the wafer surface to the tape. At least a portion of the processed wafer and at least a portion of the tape which has been exposed to the radiation are then separated from one another.

34 Claims, 5 Drawing Sheets

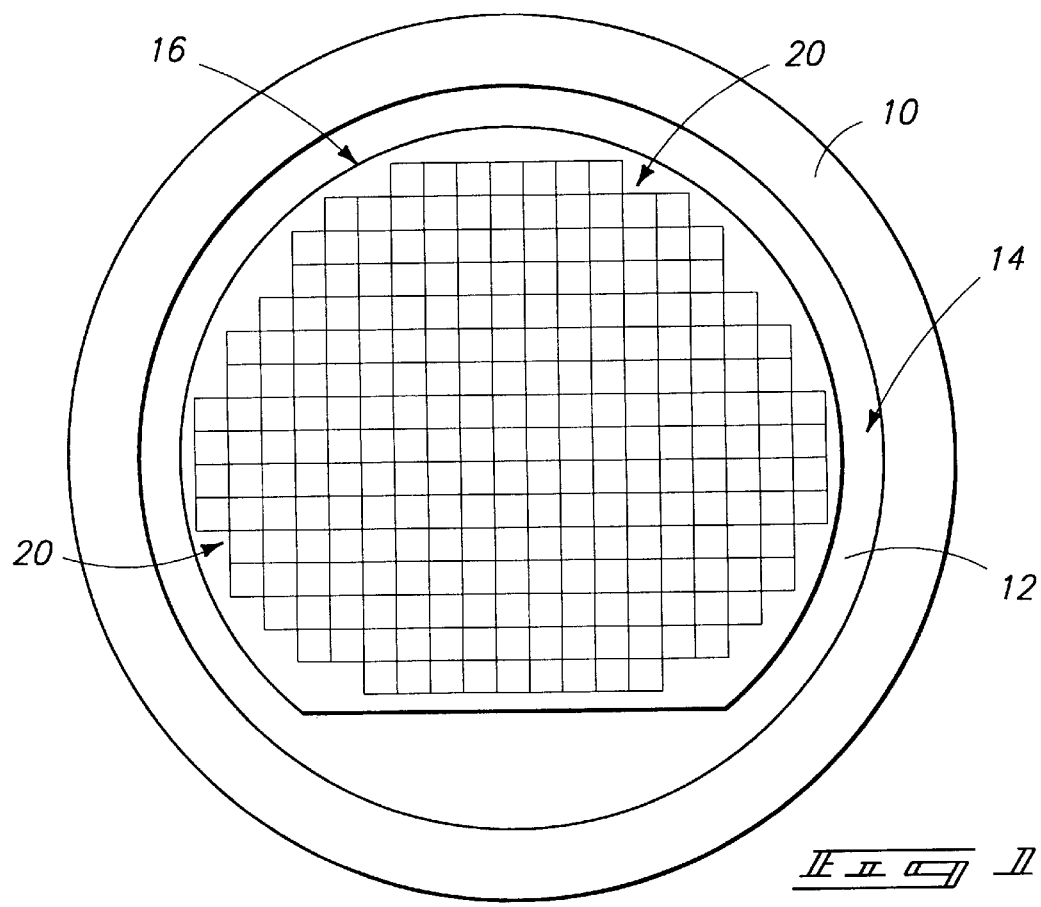
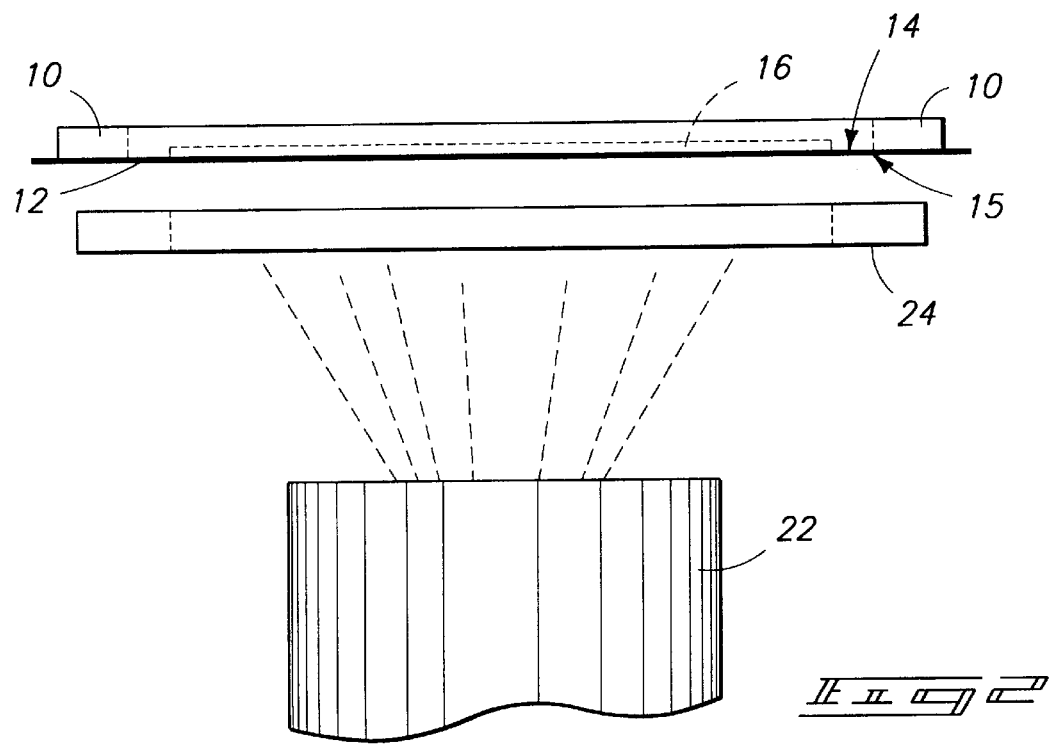

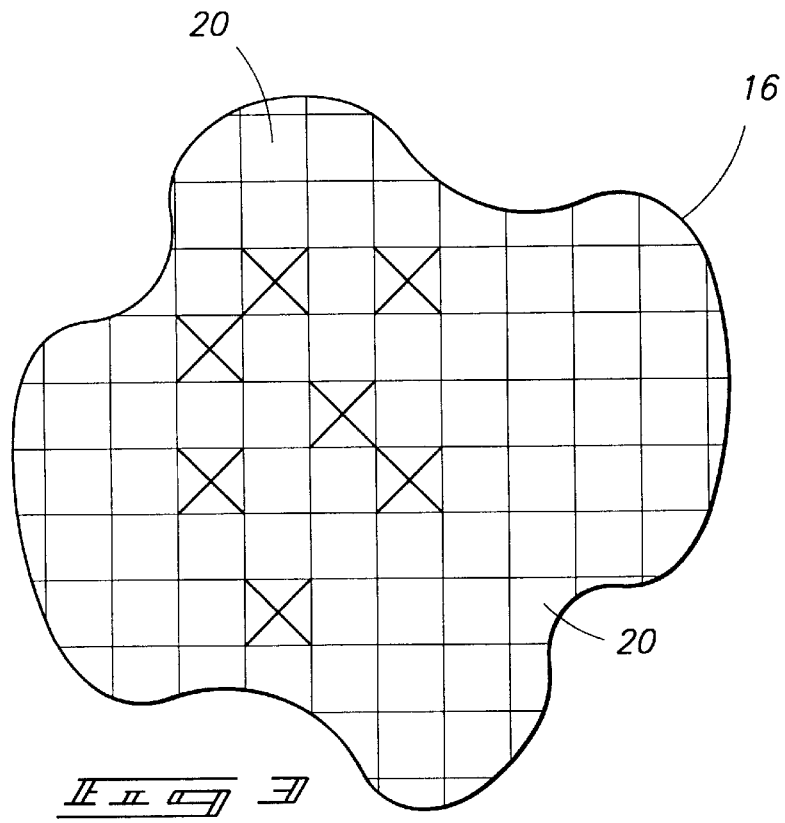
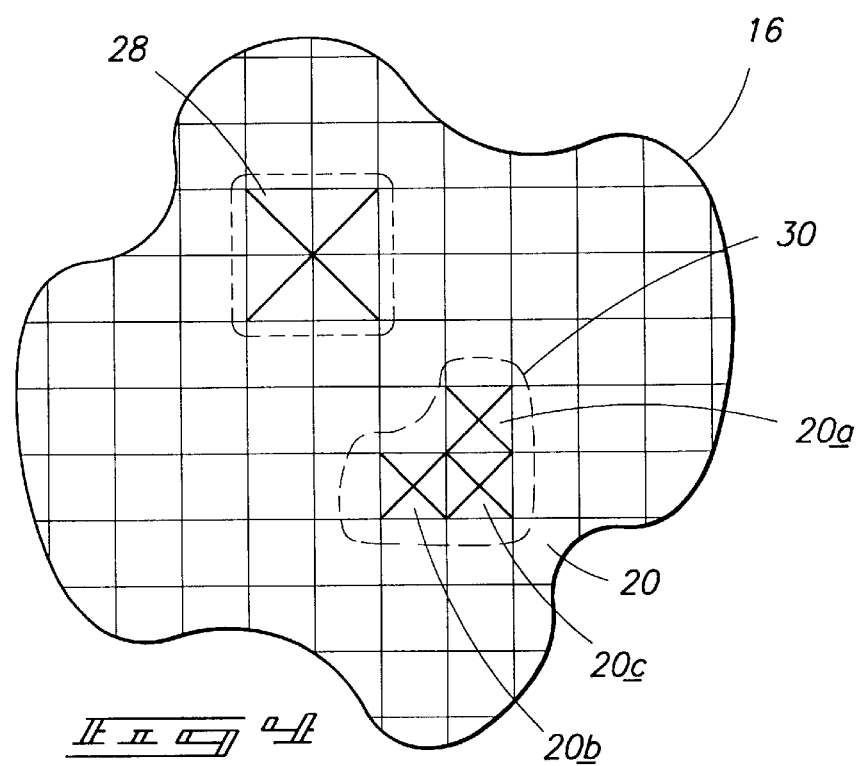

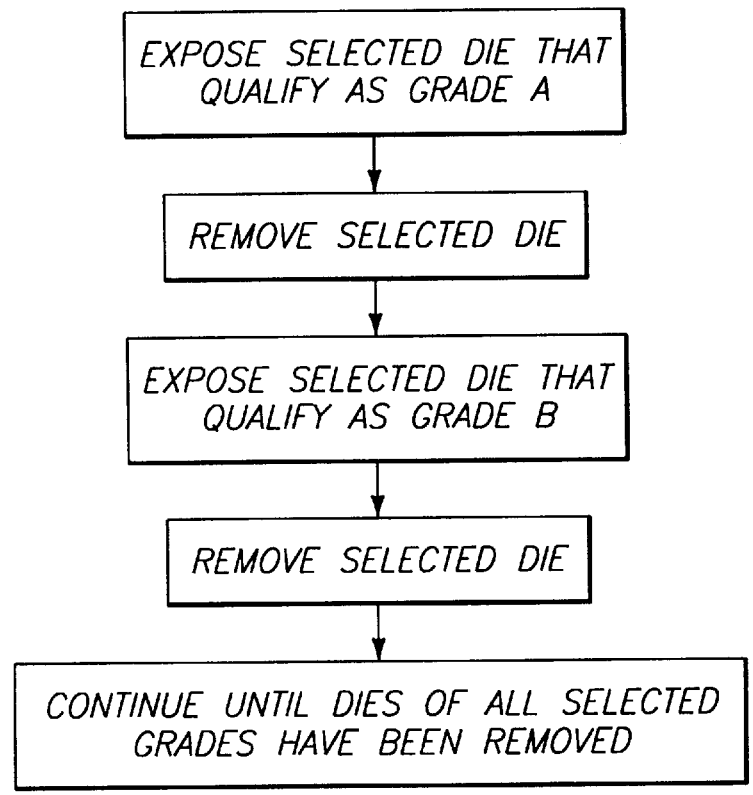
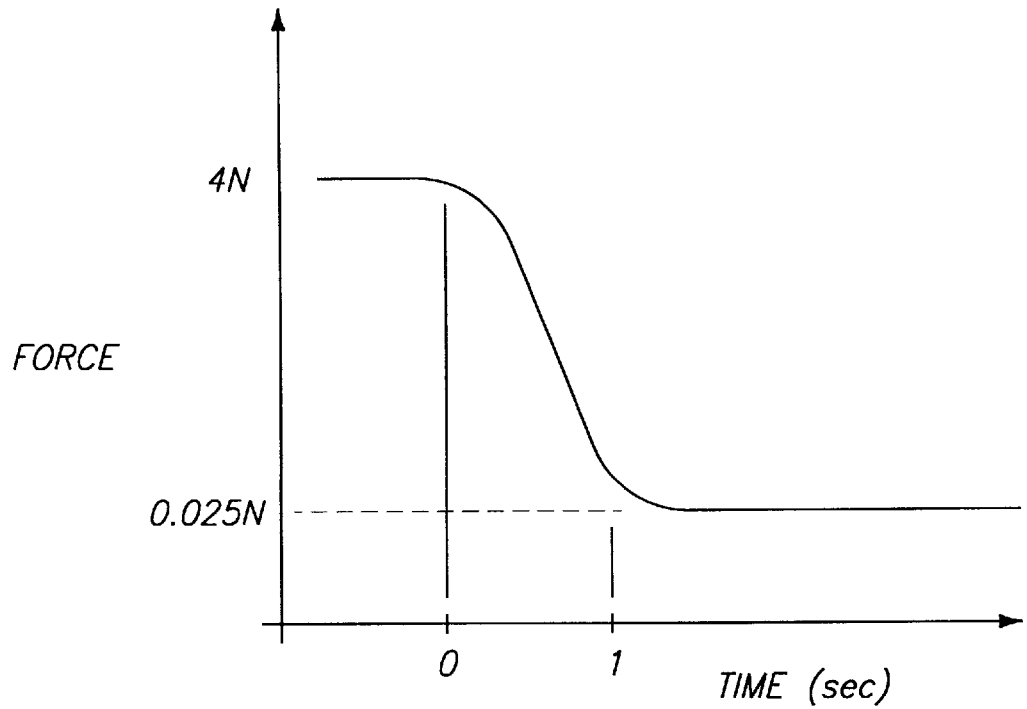

SEMICONDUCTOR WAFER PROCESSING METHOD

TECHNICAL FIELD

This invention relates to semiconductor wafer processing methods involving adherence and removal of semiconductor wafer surfaces from radiation sensitive tape and from other films.

BACKGROUND OF THE INVENTION

Most semiconductor wafer processing fabricates multiple different areas on a wafer into identical circuitry which is subsequently cut from the wafer into individual chips or die. These are then fabricated into finished packages. One technique for cutting or singulating a wafer into individual die includes mechanical cutting with a diamond cutting wheel. One technique for holding the wafer during cutting includes use of a circular metal ring which is larger than the wafer being cut. A thin film, commonly referred to in the industry as cutting film, sticky backs or tape, is tightly spread over and across the metal ring. One side of the tape is provided to be tacky, while the opposing side is not. The tacky side is adhered to the ring. A surface of the wafer is substantially centrally positioned relative to the ring and adhered to the tacky side of the tape. With the wafer so adhered, the metal ring is then positioned relative to a cutting device which orients the holder and cuts the wafers along designated scribe lines or street areas on the wafer, where circuitry has typically not been fabricated, for separating the wafer into individual die.

The cut individual die remain attached to the tape due to the stickiness of the tape. Vacuum-type pick-and-place devices then engage individual selected die to pull such from the tape for positioning onto lead frames or other devices for incorporation into finished product. Testing of the individual die for operability is typically conducted prior to the cutting operation.

Unfortunately, the tacky nature of the tape is in some instances so great that the pick device can damage or fracture the die as it is being pulled from the tape. The problem is exacerbated with larger die.

One prior art technique of overcoming this problem utilizes a tape which upon exposure to ultraviolet light becomes less tacky. The ability to change the adhesive force on the tape allows for high adhesion during the wafer dicing operation, and then a lower adhesion during the die removal operation where the die are pulled from the tape. This reduces the force required for the die attach equipment to remove the die from the tape, yet provides maximum adhesion during the dicing operation. Certain ultraviolet light sensitive wafer tapes can provide an adhesion reduction factor of three or greater to achieve this purpose. The prior art exposes the entire back side of the tape stretched over the metal ring in achieving adhesion reduction. All of the die then become more loosely associated with the tape, such that picking and placing of the die can thereafter occur.

SUMMARY OF THE INVENTION

In one aspect of the invention, adhesive force on less than all die on a cutting support film after cutting is reduced such that only selected die are readily displaceable from the tape or film. In one embodiment, a semiconductor wafer surface is adhered to an area on radiation sensitive tape. The wafer is processed on the tape. Cutting such wafer into individual die is one example processing. Less than all of the tape area is then exposed to radiation effective to reduce degree of adhesion of the wafer surface to the tape. At least a portion of the processed wafer and at least a portion of the tape which has been exposed to the radiation are then separated from one another.

BRIEF DESCRIPTION OF THE DRAWINGS

Preferred embodiments of the invention are described below with reference to the following accompanying drawings.

FIG. 1 is a plan view of a semiconductor wafer retained centrally relative to a tape carrier ring for processing in accordance with the invention.

FIG. 2 is a sectional view of the FIG. 1 wafer, and includes an example of but one of many types of processing equipment utilizable in accordance with the invention.

FIG. 3 is an enlarged view of a portion of the wafer exposed to radiation by the process depicted by FIGS. 1 and 2.

FIG. 4 is an alternate view of an enlarged portion of such wafer.

FIG. 9 is a process flow diagram in accordance with an aspect of the invention.

FIG. 10 is a graph of adhesion force as a function of time for a certain ultraviolet light sensitive tape.

DETAILED DESCRIPTION OF THE PREFERRED EMBODIMENTS

Figure 5:
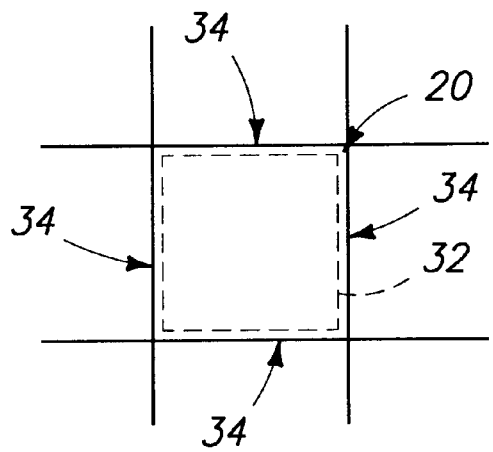
FIG. 5 is an even greater enlargement view of a portion of a wafer exposed to ultraviolet light in accordance with an aspect of the invention.

This disclosure of the invention is submitted in furtherance of the constitutional purposes of the U.S. Patent Laws "to promote the progress of science and useful arts" (Article 1, Section 8).

Referring initially to FIG. 1, a circular carrier or film frame 10 has a radiation sensitive tape 12 stretched thereover. A preferred radiation sensitive tape in accordance with the above-described prior art is ultraviolet light sensitive tape, whereupon exposure to ultraviolet light reduces the tackiness or stickiness of the tape. Specific examples are ultraviolet light sensitive dicing tapes FS-7153 and 353EP made by Furukawa Electric Co. Ltd. of Japan. Radiation sensitive tape 12 has a front side 14 which is preferably provided to be tacky and is adhered to the underside of ring 10. It also has a back side 15 (FIG. 2) which is preferably not provided to be tacky.

A semiconductor wafer 16 has one of its surfaces adhered to an area on sticky tape side 14. Preferably as shown, wafer 16 is approximately centrally adhered relative to carrier ring 10. Semiconductor wafer 16 has been fabricated into a plurality of die areas 20 (FIG. 1) which in the described embodiment will comprise separate or individual chips when cut from wafer 16. In the preferred embodiment, wafer 16 has been completely processed with all circuitry within the respective die areas 20 such that semiconductor wafer 16 is ready for cutting or singulation into individual die.

At least a portion of wafer 16, and preferably the entirety of wafer 16, is then cut such as using a diamond saw blade into a plurality of die such that the wafer now in die form is adhered to the tape. Preferably prior to cutting, the individual die have been tested for acceptable operability such that either operable or inoperable die will be selected for removal from the tape. Typically, operable die are selected for picking from the tape for subsequent packaging and more test, with inoperable die being discarded after removal of the operable die.

At this point, less than all of the tape area over which semiconductor wafer 16 lies is exposed to radiation effective to reduce the degree of adhesion of the adhered wafer surface to the tape. Such can be accomplished in a number of different manners, with but one preferred embodiment being described with reference to FIG. 2. There illustrated is carrier ring 10 having tape 12 and semiconductor wafer 16, ideally previously diced, positioned relative to a radiation exposure apparatus. Such comprises an ultraviolet light source 22 and a mask 24 provided intermediate carrier ring 10 and ultraviolet light source 22. In one example, ultraviolet light mask 24 can be configured with a single opening corresponding roughly in size and shape to that of a single die. Such opening of mask 24 could then be stepped over the various portions of wafer 16 to selectively irradiate the back side 15 of tape 12 under the selected die, and thus subject less than all of tape 12 to ultraviolet light exposure. A shutter (not shown) would preferably be utilized intermediate ultraviolet light source 22 and ultraviolet light mask 24 while the masked opening was positioned from one die area to another die area so ultraviolet light source 22 could be left "on".

FIG. 3 shows an example whereby multiple discrete areas of the tape area have been exposed, as indicated by the X'd die, for reducing adhesion of such particular selected die to the tape for easier removal therefrom.

FIG. 4 illustrates processing where multiple of the discrete exposed areas individually encompass multiple die. For example, FIG. 4 illustrates two example discrete areas 28 and 30. Region 30 illustrates three contiguous die 20a, 20b, and 20c. Die pairs 20a and 20c, and 20c and 20b respectively constitute two adjacent die, with the three die collectively being contiguous among the group. Area 28 illustrates four contiguous die. Where it was desired to expose a group or cluster of such die, such as in areas 28 and 30, a continuous exposure area could be provided in the radiation mask extending between and over at least a portion of each of the contiguous die. Such could thereby be exposed in a common exposure step, and thereafter removed from the exposed portion of the tape more easily.

Figure 6:
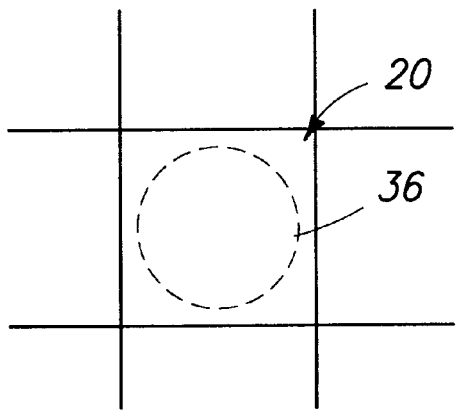
FIG. 6 is another enlarged view on the order of the scale of FIG. 5 showing an alternate embodiment.
Figure 7:
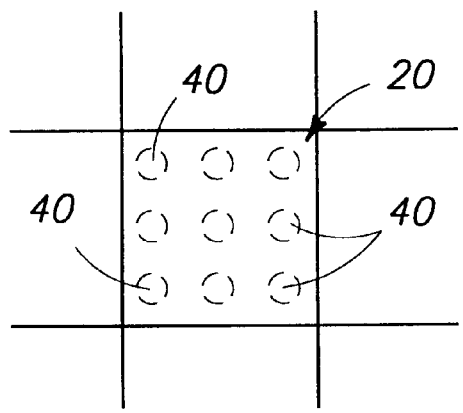
FIG. 7 is yet another enlarged view of an alternate embodiment wafer fragment on the scale of FIG. 5 showing another alternate processing in accordance with the invention.

FIGS. 5–7 illustrate exemplary exposure patterns for an individual die. For example, FIG. 5 illustrates an exemplary die area 20 and an exposure area 32 to ultraviolet light radiation which would be sized and shaped by mask 24 (FIG. 2). Preferably, the exposure area of an individual die to assure adequate reduction in adhesive force relative to the die constitutes at least 50% of the tape area adhered to individual selected die surface area. Greater than or equal to 75% is even more preferred, with approximately 90% being shown by the exposure area 32 in FIG. 5.

Die area 20 is shown to have a peripheral boundary or border 34 defining a die shape in that of a rectangle, which in the illustrated embodiment is a square. Exposure area 32 is shown to be received within the periphery 34 of an individual selected die 20, with exposure area 32 defining a discrete exposure area shape which is essentially the same as that of the die shape.

Alternate shapes are possible. For example, FIG. 6 illustrates an exposure area 36 in the form of a circle and received within the peripheral confines of the illustrated die area 20. Non-rectangular and non-circular exposure areas, such as triangular and others, are also contemplated. Such provide examples of shapes which are different than that of the die shape.

FIG. 7 illustrates another embodiment wherein the exposure area is defined by multiple discrete areas received within the peripheral confines of an individual die. In this illustrated and preferred example, multiple discrete circular or dot-like areas 40 are provided within a single die 20 to achieve an overall reduction in adhesion of the particular die to such area on the tape.

In accordance with the above-described embodiments, preferably all cutting of the wafer is conducted before radiation exposure to reduce adhesion of the wafer surface to the tape. Further, the wafer might be processed by other than cutting, or certain selected areas of the wafer exposure to ultraviolet light occurring prior to cutting or other processing. Further, unused or unacceptable die can be discarded with the tape at the conclusion of removal of the operable die.

The prior art is understood to disclose ultraviolet light exposure of the entire surface of the tape such that all of the die in the same processing step have reduced adhesion to the tape surface. This creates considerable risk in moving the wafer carrier after ultraviolet light exposure and before all desired chips or die have been removed from the tape. With all die having reduced adhesion, there was considerable risk of desired die being displaced or falling from the tape prior to removal therefrom after ultraviolet light exposure. In one aspect of the invention, less than all die after cutting have reduced adhesive force such that only selected die are readily displaceable from the tape. Although described with respect to radiation sensitive tape, use of other films and other methods of reducing adhesion force between the film and substrate for less than all of the adhered substrate surface are contemplated.

The above-described preferred embodiment processing could be used to enable convenient handling of a diced wafer with the wafer carrier after selective radiation exposure such that the carrier might be moved to another location or station for further processing. Additionally, such can be used to facilitate fabrication of different circuitry die on the same wafer.

Figure 8:
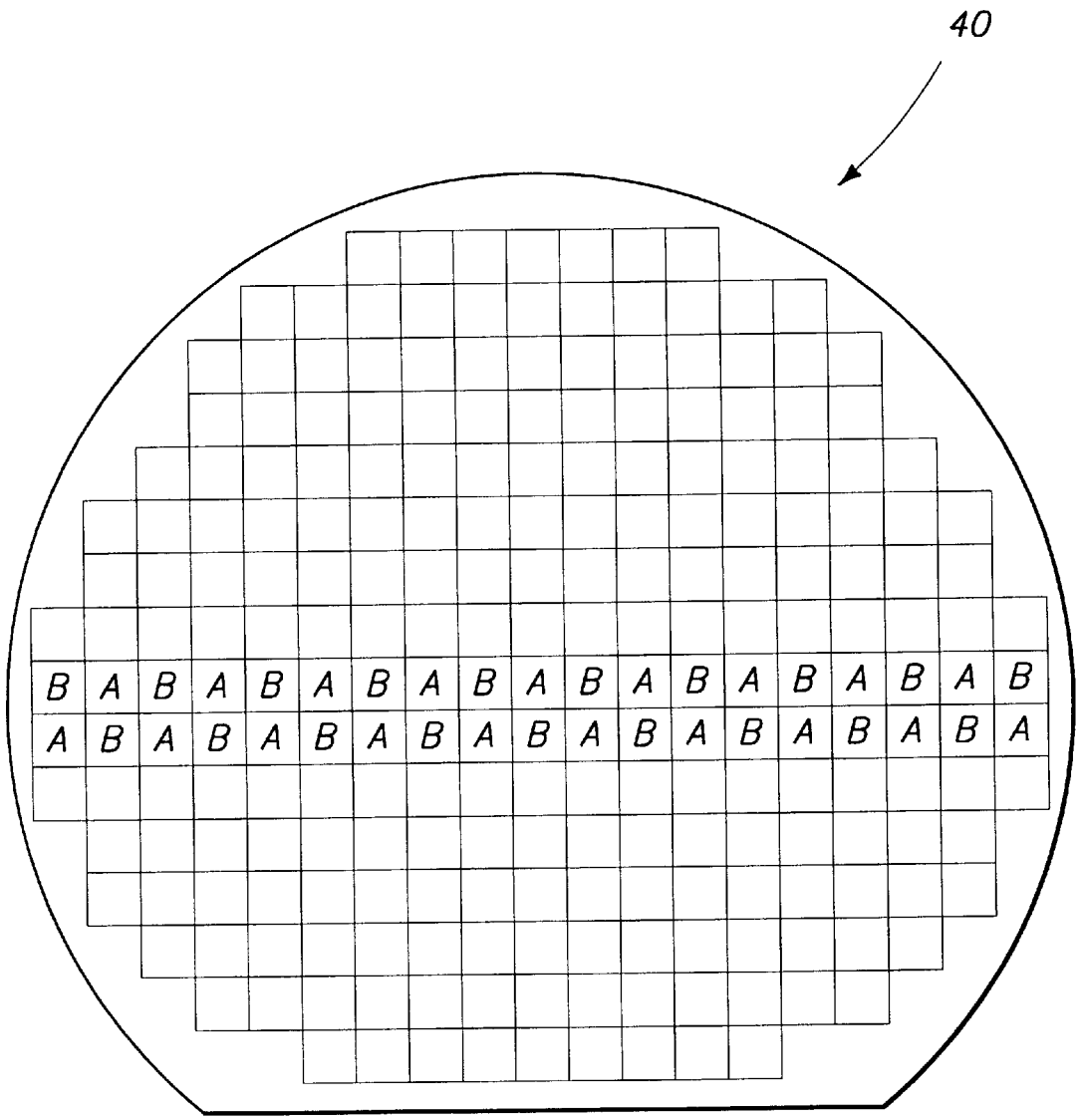
FIG. 8 is a top view of another semiconductor wafer used in the ensuing description of yet another alternate embodiment processing in accordance with the invention.

For example, FIG. 8 illustrates a semiconductor wafer 40 fabricated into multiple die areas indicated by "A" and "B". These multiple die areas comprise in this example two different die sets fabricated to constitute different circuitry, with the "A" die constituting one set and the "B" die constituting another set. More sets could, of course, be fabricated on the same wafer. After fabrication and preferably after determining selected die from the respective sets, wafer 40 would be cut to separate at least some of the multiple die areas adhered on the tape into adhered die. Then, those portions of the tape exposed to selected die areas of only a single of the different die sets could be exposed to radiation effective to reduce the degree of adhesion of the selected die areas of that particular set to the tape. For example, all selected die only within die set "A" could be exposed to radiation and thereafter easily removed from the tape. Then, selected die of the remaining set "B" could then be exposed to radiation for removal from the tape. Further, movement of the carrier ring with the die adhered thereto could be more safely and readily conducted intermediate the processing for subsequent removal with respect to the "B" set of die.

Further, FIG. 9 depicts a process flow usable for example to select and remove different grade die. FIG. 10 illustrates a graph of adhesion force as a function of time of 100 mW ultraviolet light exposure for the 353EP dicing tape made by Furukawa Electric Co. Ltd. of Japan.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor wafer processing method comprising:
   adhering a semiconductor wafer surface of a semiconductor wafer to an area on a support film, the wafer having been processed into a plurality of interconnected individual die;
   after the adhering, cutting at least a portion of the wafer into individual die adhered on the support film;
   determining selected die, the selected die constituting less than all individual die of the wafer;
   after the cutting and after the determining, reducing degree of adhesion of the selected die to the film as compared to degree of adhesion of nonselected die to the film; and
   after the reducing, separating the selected die and the support film from one another.

2. The semiconductor wafer processing method of claim 1 wherein the reducing comprises radiation exposure.

3. The semiconductor wafer processing method of claim 1 wherein the reducing comprises light exposure.

4. A semiconductor wafer processing method comprising:
   adhering a semiconductor wafer surface of a semiconductor wafer to an area on radiation sensitive tape, the wafer having been processed into a plurality of interconnected individual die;
   after the adhering, cutting at least a portion of the wafer into individual die adhered on the tape;
   determining selected die, the selected die constituting less than all individual die of the wafer:
   after the cutting and after the determining, exposing less than all of the tape area to radiation effective to reduce degree of adhesion of the the selected die to the tape as compared to degree of adhesion of nonselected die to the tape; and
   after the reducing, separating the selected die and the support film from one another.

5. The semiconductor wafer processing method of claim 4 wherein the tape is sensitive to UV radiation and the exposing comprises UV radiation exposure.

6. The semiconductor wafer processing method of claim 4 wherein the tape area subjected to the exposing is entirely received within peripheral confines of individual of the selected die.

7. The semiconductor wafer processing method of claim 4 wherein the exposing comprises exposing multiple discrete areas of the tape area within peripheral confines of individual of the selected die.

8. The semiconductor wafer processing method of claim 4 wherein the exposing exposes at least 50% and less than 100% of the adhered surface area of individual selected die.

9. The semiconductor wafer processing method of claim 4 wherein the exposing exposes at least 75% and less than 100% of the adhered surface area of individual selected die.

10. The semiconductor wafer processing method of claim 4 wherein the exposing exposes at least 90% and less than 100% of the adhered surface area of individual selected die.

11. The semiconductor wafer processing method of claim 4 wherein the exposing maintains the degree of adhesion of the nonselected die to be the same as before the exposing.

12. The semiconductor wafer processing method of claim 4 wherein the exposing comprises exposing multiple discrete areas of the tape area after the cutting, at least a single of the discrete areas encompassing multiple of the selected die.

13. The semiconductor wafer processing method of claim 4 comprising fabricating the semiconductor wafer into multiple dies comprising at least two different die sets comprising different circuitry prior to said cutting, the selected die constituting only one of the two die sets.

14. A semiconductor wafer processing method comprising:
   adhering a semiconductor wafer surface to an area on radiation sensitive tape;
   cutting at least a portion of the wafer into die adhered on the tape;
   after the cutting, exposing less than all of the tape area to radiation effective to reduce degree of adhesion of the wafer surface to the tape; said exposing comprising masking an entirety of at least one die during the exposing; and
   removing cut die from portions of the tape which have been exposed to the radiation.

15. The semiconductor wafer processing method of claim 14 wherein the exposing comprises exposing multiple discrete areas of the tape area.

16. The semiconductor wafer processing method of claim 14 wherein the exposing comprises exposing multiple discrete areas of the tape area after the cutting, at least a single of the discrete areas encompassing multiple die.

17. The semiconductor wafer processing method of claim 14 wherein the exposing comprises exposing multiple discrete circular areas of the tape area.

18. The semiconductor wafer processing method of claim 14 wherein the exposing comprises exposing multiple discrete rectangular areas of the tape area.

19. The semiconductor wafer processing method of claim 14 wherein the exposing comprises exposing multiple discrete non-rectangular and non-circular areas of the tape area.

20. The semiconductor wafer processing method of claim 14 wherein the exposing comprises exposing multiple discrete areas of the tape area after the cutting, individual of the discrete areas being received within peripheral confines of an individual of the cut die.

21. The semiconductor wafer processing method of claim 14 wherein the exposing comprises exposing multiple discrete areas of the tape area within peripheral confines of an individual of the die.

22. The semiconductor wafer processing method of claim 14 wherein individual of the die have a periphery defining a die shape, the exposing comprises exposing multiple discrete areas of the tape area after the cutting, individual of the discrete areas being received within an individual die periphery and having a periphery defining a discrete exposure area shape the same as that of the die shape.

23. The semiconductor wafer processing method of claim 14 wherein individual of the die have a periphery defining a die shape, the exposing comprises exposing multiple discrete areas of the tape area after the cutting, individual of the discrete areas being received within an individual die periphery and having a periphery defining a discrete exposure area shape which is different than that of the die shape.

24. A semiconductor wafer processing method comprising:
   adhering a semiconductor wafer surface fabricated into die areas to an area on radiation sensitive tape;
   cutting at least a portion of the wafer into die adhered on the tape, individual cut die having a respective surface area adhered to a portion of the tape area;
   determining selected die;
   after the cutting, exposing at least 50% of the tape area adhered to individual selected die surface area to radiation effective to reduce degree of adhesion to the tape, said exposed tape area constituting less than 100% of the tape area adhered to the semiconductor wafer surface; said exposing comprising masking an entirety of at least one die during the exposing; and
   removing cut and selected die from the tape after the exposing.

25. The semiconductor wafer processing method of claim 24 comprising exposing at least 75% of the tape area adhered to individual selected die surface area to radiation effective to reduce degree of adhesion to the tape.

26. The semiconductor wafer processing method of claim 24 comprising exposing at least 90% of the tape area adhered to individual selected die surface area to radiation effective to reduce degree of adhesion to the tape.

27. The semiconductor wafer processing method of claim 24 wherein the exposing comprises exposing multiple discrete areas of the tape area after the cutting, at least a single of the discrete areas encompassing multiple selected die.

28. The semiconductor wafer processing method of claim 24 wherein the exposing comprises exposing multiple discrete areas of the tape area within peripheral confines of an individual of the selected die.

29. The semiconductor wafer processing method of claim 24 wherein individual of the selected die have a periphery defining a die shape, the exposing comprises exposing multiple discrete areas of the tape area after the cutting, individual of the discrete areas being received within an individual selected die periphery and having a periphery defining a discrete exposure area shape the same as that of the die shape.

30. The semiconductor wafer processing method of claim 24 wherein individual of the selected die have a periphery defining a die shape, the exposing comprises exposing multiple discrete areas of the tape area after the cutting, individual of the discrete areas being received within an individual selected die periphery and having a periphery defining a discrete exposure area shape which is different than that of the die shape.

31. A semiconductor wafer processing method comprising:
   adhering a semiconductor wafer surface fabricated into die areas to an area on radiation sensitive tape;
   cutting at, least a portion of the wafer into die adhered on the tape, individual cut die having a respective surface area adhered to a portion of the tape area;
   determining at least two adjacent selected die;
   after the cutting, exposing only a portion of the tape area to radiation effective to reduce degree of adhesion of the wafer surface to the tape, the tape area portion comprising a continuous exposure area extending between and covering at least a portion of the at least two adjacent selected die; said exposing comprising masking an entirety of at least one die other than the two during the exposing; and
   removing the at least two adjacent selected die from the tape after the exposing.

32. The semiconductor wafer processing method of claim 31 comprising determining at least three contiguous die, the continuous exposure area extending among at least a portion of the at least three contiguous selected die, and the removing comprising removing the at least three contiguous selected die from the tape after the exposing.

33. The semiconductor wafer processing method of claim 31 comprising determining at least four contiguous die, the continuous exposure area extending among at least a portion of the at least four contiguous selected die, and the removing comprising removing the at least four contiguous selected die from the tape after the exposing.

34. A semiconductor wafer processing method comprising:
   fabricating a semiconductor wafer into multiple die areas, the multiple die areas comprising at least two different die sets comprising different circuitry;
   adhering a surface of the semiconductor wafer to an area on radiation sensitive tape;
   cutting at least a portion of the wafer to separate at least some of the multiple die areas adhered on the tape into adhered die;
   exposing tape adhered to selected die areas of only a single of the different die sets to radiation effective to reduce degree of adhesion of the selected die areas to the tape; and
   removing cut selected die of the single set from portions of the tape which have been exposed to the radiation.

* * * * *